(12) United States Patent
Dake

(10) Patent No.: US 12,155,376 B2
(45) Date of Patent: Nov. 26, 2024

(54) DRIVER DISCHARGE CIRCUIT

(71) Applicant: TEXAS INSTRUMENTS INCORPORATED, Dallas, TX (US)

(72) Inventor: Tuli Dake, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/165,503

(22) Filed: Feb. 7, 2023

(65) Prior Publication Data

US 2024/0204765 A1    Jun. 20, 2024

Related U.S. Application Data

(60) Provisional application No. 63/432,567, filed on Dec. 14, 2022.

(51) Int. Cl.
   *H03K 17/08*    (2006.01)
   *H03K 17/0812*  (2006.01)
   *H02M 1/08*     (2006.01)

(52) U.S. Cl.
   CPC ......... *H03K 17/08122* (2013.01); *H02M 1/08* (2013.01)

(58) Field of Classification Search
   CPC .............................................. H03K 17/08122
   USPC ...................................................... 327/109
   See application file for complete search history.

(56) References Cited

U.S. PATENT DOCUMENTS

| 11,791,709 | B2 * | 10/2023 | Giandalia | .............. H02M 3/155 |
|---|---|---|---|---|
| | | | | 327/396 |
| 2004/0027756 | A1 | 2/2004 | Sander | |
| 2006/0209479 | A1 | 9/2006 | Grombach | |
| 2006/0214704 | A1 | 9/2006 | Nakano | |
| 2010/0157493 | A1 | 6/2010 | Guedon | |
| 2011/0148476 | A1 | 6/2011 | Fanic | |
| 2012/0176164 | A1 | 7/2012 | Arndt | |
| 2017/0302066 | A1 | 10/2017 | Gao | |
| 2017/0373490 | A1 | 12/2017 | Zhu | |

OTHER PUBLICATIONS

International Search Report dated Apr. 26, 2024.

* cited by examiner

*Primary Examiner* — Tomi Skibinski
(74) *Attorney, Agent, or Firm* — Charles F. Koch; Frank D. Cimino

(57) ABSTRACT

A driver includes first and second switches. A first transistor has a first control input and first and second current terminals. A resistor couples between a voltage supply terminal and the first control input. A configurable voltage clamp circuit has a voltage clamp control input and a voltage clamp circuit output coupled to the first control input. A second transistor has a second control input and third and fourth current terminals. A logic circuit includes a comparator having a comparator output. The logic circuit couples to the voltage supply terminal and the voltage clamp control input. The logic circuit is configured to configure the voltage clamp circuit for a first clamp voltage at the voltage clamp circuit output responsive to the first switch being turned ON and for a second clamp voltage at the voltage clamp circuit output based on a signal at the comparator output.

20 Claims, 7 Drawing Sheets

DRIVER DISCHARGE CIRCUIT

CROSS-REFERENCE TO RELATED APPLICATIONS

This application claims priority to U.S. Provisional Application No. 63/432,567 filed Dec. 14, 2022, entitled "Primer for Transparent High Voltage Driver Over Stress Mitigation, which is hereby incorporated by reference.

BACKGROUND

An electrical circuit includes any of a variety of electrical components such as transistors, resistors, capacitors, diodes, inductors, etc. Electrical circuits can perform any of a multitude of different functions. However, it is possible that an electrical overstress condition may occur, which may be harmful to one or more of the components of the electrical circuit.

SUMMARY

A driver includes first and second switches. A first transistor has a first control input and first and second current terminals. A resistor couples between a voltage supply terminal and the first control input. A configurable voltage clamp circuit has a voltage clamp control input and a voltage clamp circuit output coupled to the first control input. A second transistor has a second control input and third and fourth current terminals. A logic circuit includes a comparator having a comparator output. The logic circuit couples to the voltage supply terminal and the voltage clamp control input. The logic circuit is configured to configure the voltage clamp circuit for a first clamp voltage at the voltage clamp circuit output responsive to the first switch being turned ON and for a second clamp voltage at the voltage clamp circuit output based on a signal at the comparator output.

DETAILED DESCRIPTION

Figure 1:
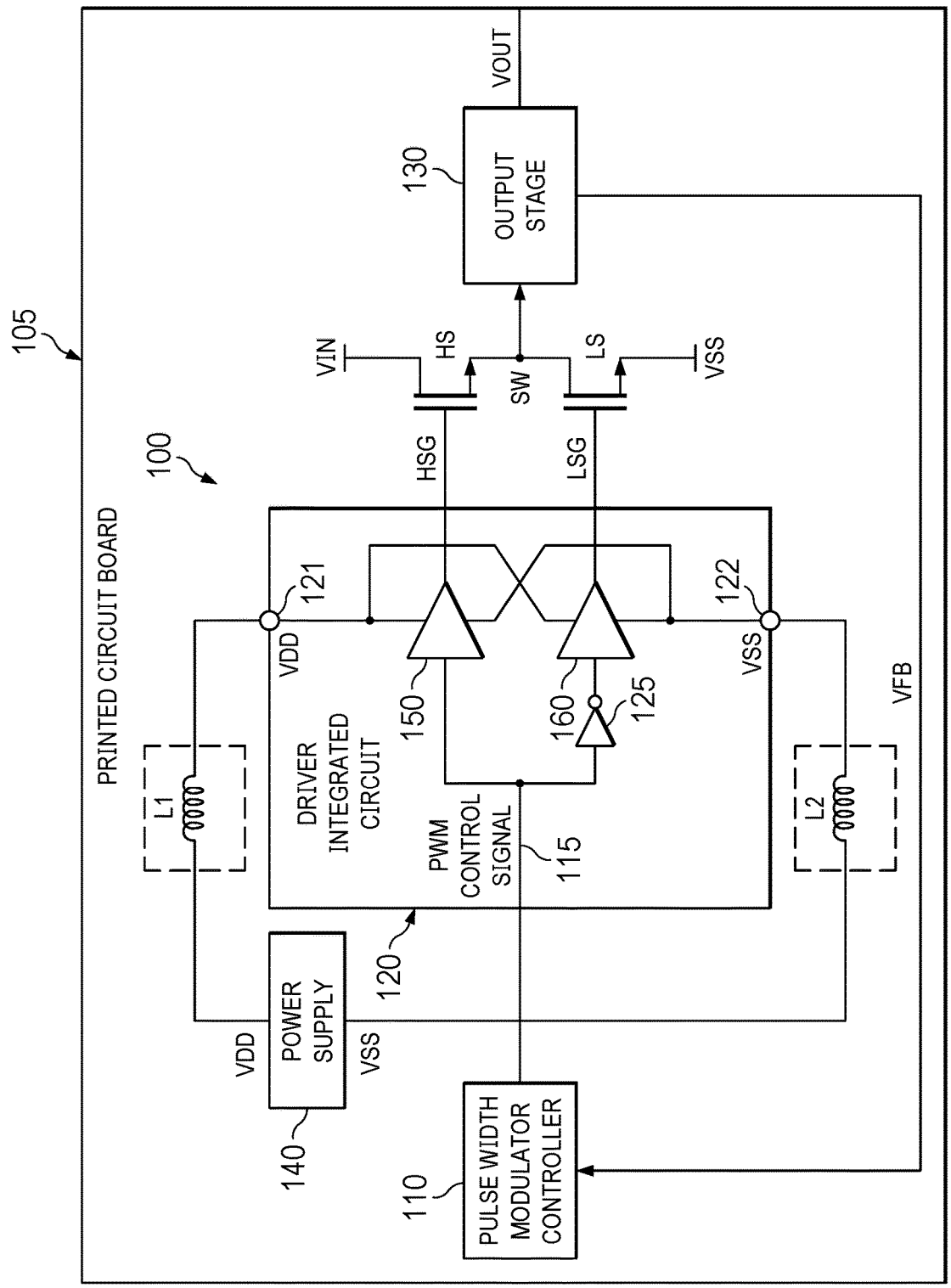
FIG. 1 is a circuit schematic of an electrical system that includes transistor drivers that may be subject to electrical overstress conditions, in an example.

The same reference numbers or other reference designators are used in the drawings to designate the same or similar (either by function and/or structure) features.

The examples described herein pertain to discharge circuits for discharging energy from a parasitic inductance to protect a transistor within a driver from an electrical overstress condition. However, the principles described herein can be applied to other applications in addition to drivers.

FIG. 1 is a circuit schematic of a system 100. The system 100 includes a pulse width modulator (PWM) controller 110, a driver integrated circuit (IC) 120, a high side (HS) transistor, a low side (LS) transistor, an output stage 130, and a power supply 140. The power supply 140 provides a supply voltage (VDD referenced to VSS) to power supply terminals 121 and 122 of the driver IC 120 (connections shown) and to the PWM controller 110 (connections not shown). The HS transistor and the LS transistor are n-channel field effect transistors (NFETs) in this example. The voltage on the gate of the HS transistor is HSG, and the voltage on the gate of the LS transistor is LSG. The source of the HS transistor is coupled to the drain of the LS transistor at a switch node (SW). The output stage 130 is coupled to the SW node. The output stage 130 may produce an output voltage (VOUT). The output stage 130 also generates a feedback voltage (VFB) which is proportional to the output voltage (e.g., via a resistor divider, not shown). The feedback voltage VFB is provided to an input of the PWM controller 110, and the PWM controller (which may be fabricated as an IC separate from the driver IC 120) produces a PWM control signal 115. The driver IC 120 includes a high side driver 150 and a low side driver 160, which control the ON and OFF state of the respective HS and LS transistors. The PWM control signal 115 is provided to an input of the high side driver 150, and, through inverter 125, the logical inverse of the PWM control signal 115 is provided to an input of the low side driver 160. The PWM controller 110, driver IC 120, HS and LS transistors, the output stage 130, and the power supply 140 may be mounted on a printed circuit board (PCB) 105 or other suitable medium for interconnecting the components.

The system 100 may be implemented to provide any of a variety of functions. For example, the system 100 may be a switching voltage converter, such as a buck converter, boost converter, buck boost converter, half bridge converter, full bridge converter, etc. The output stage 130 is specific to the particular type of converter. For example, in the case of a buck converter, the output stage 130 includes an inductor coupled to an output capacitor. One terminal of the inductor is coupled to the switch node. The other terminal of the inductor is coupled to the output capacitor and provides the output voltage VOUT. By way of another example, in the case of a half bridge converter, the output stage 130 includes a transformer. The primary side of the transformer may be coupled to the switch node. The output stage also includes a rectifier coupled to the secondary side of the transformer to produce the output voltage VOUT. In other examples, system 100 may be a motor controller or a class D audio amplifier.

FIG. 1 shows parasitic inductances L1 and L2. Parasitic inductance L1 includes parasitic inductance of the PCB's traces (or other types of conductive elements) between the power supply's VDD output and the power supply terminal 121 of the driver IC 120. Parasitic inductance L1 also may include the parasitic inductance of the connection (e.g., bond wire, pin) between the PCB and the driver IC's voltage supply terminal 121. Similarly, parasitic inductance L2 includes the parasitic inductance of the PCB trace and the PCB/driver IC connection (e.g., bond wire, pin) between the power supply's VSS output and the driver IC's power supply ground terminal 122. The parasitic inductances L1 and L2 can cause an electrical overstress condition for the high side driver 150 and/or the low side driver 160, as explained below with respect to FIG. 2.

Figure 2:
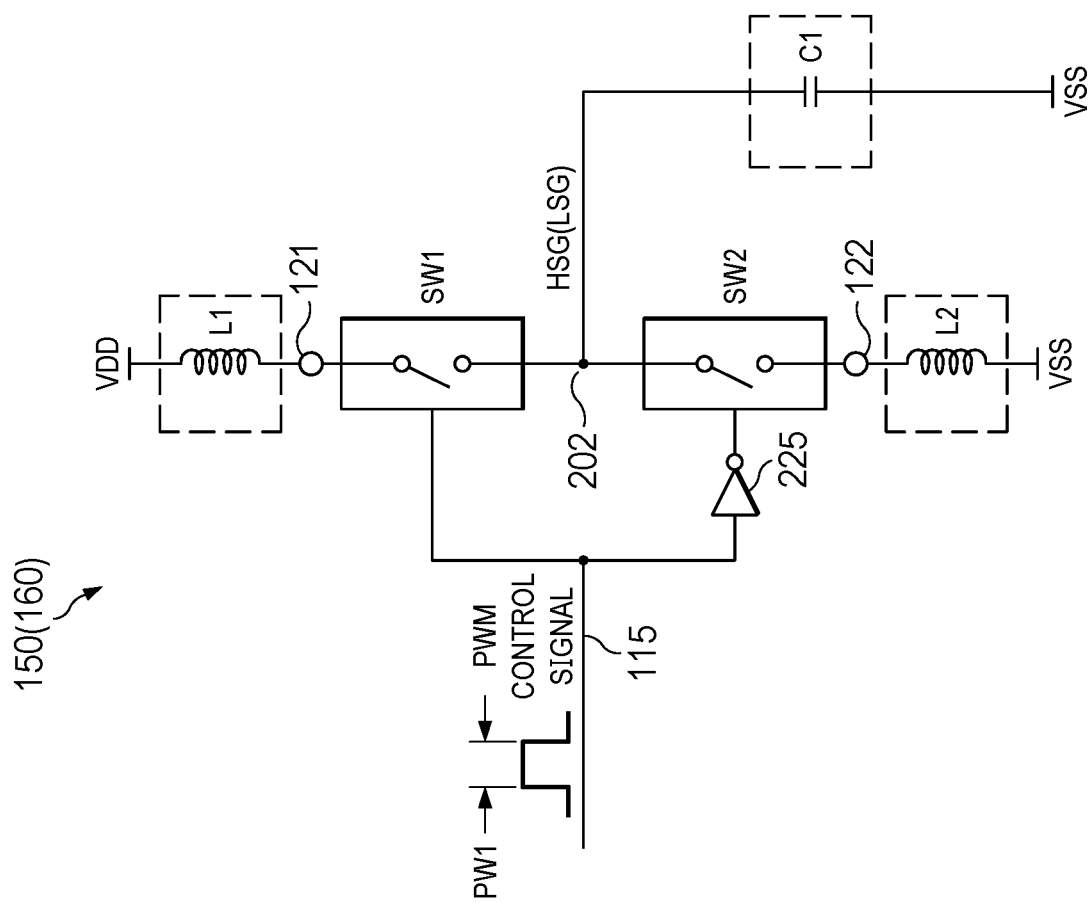
FIG. 2 is a circuit schematic of at least a portion of a driver further illustrating a potential electrical overstress condition, in an example.

FIG. 2 is a schematic of at least a portion of the high side driver 150 and the low side driver 160. The input signal in FIG. 2 is the PWM control signal 115, which is the input signal for the high side driver 150. The input signal for the low side driver 160 is the logical inverse of the PWM control signal 115 through inverter 125, as explained above in the example of FIG. 1. Each driver includes a first switch SW1 coupled in series to a second switch SW2 between supply terminals 121 and 122. In one example, switches SW1 and SW2 are transistors, and in one specific example, the transistors are NFETs. The connection 202 between the switches SW1 and SW2 is the output of the driver, which is coupled to the gate of the respective HS or LS transistor. In FIG. 2, the HS or LS transistor coupled to the driver is modeled as a capacitive load C1 on the driver 150 (160). The capacitive load C1 represents the gate-to-source capacitance of the respective HS or LS transistor and parasitic capacitance of the PCB and is referred to herein as parasitic capacitance C1.

When the PWM control signal 115 is logic high, switch SW1 is turns ON and SW2 is turned OFF. With switch SW1 ON, current flows from the power supply VDD voltage through the parasitic inductance L1 and switch SW1 to charge the parasitic capacitance C1 of the respective HS or LS transistor. As the current flows to charge the parasitic capacitance C1, the voltage across the parasitic capacitance C1 increases approximately linearly. The voltage across the parasitic capacitance C1 is HSG for the HS transistor (or LSG for the LS transistor). Energy is stored in an inductor as a time-changing current flows through the inductor resulting in a voltage produced across the inductor. As current flows into the gate of the HS (or LS) transistor, the voltage HSG across parasitic capacitance C1 increases, the voltage across parasitic inductance L1 (VDD-HSG) changes, and thus energy is stored in the parasitic inductance L1.

When the parasitic capacitance C1 is fully charged (HSG reaches VDD), the voltage drop across parasitic inductance L1 reduces to approximately 0V and the energy in inductance L1 decreases. Some of the energy is transferred to parasitic capacitance C1 and some is lost thermally. If, at that point (little or no energy stored in inductance L1), the PWM control signal 115 transitions to a logic low state, switch SW1 turns OFF and switch SW2 turns ON, and there is little to no energy in inductance L1 that needs to be discharged.

However, if the PWM control signal 115 transitions to the logic low state while parasitic capacitance C1 is still being charged (i.e., HSG has not yet reached VDD), then when switch SW1 turns off, energy remains stored in parasitic inductance L1, and unless the energy stored in parasitic inductance L1 is discharged, the voltage on the power supply terminal 121 may increase due to the sudden cessation of current through switch SW1 to the gate of the HS (or LS) transistor. As explained above, switch SW1 is implemented as a transistor. The transistor implementing switch SW1 is rated for maximum acceptable voltages between its terminals. For example, the maximum acceptable drain-to-source voltage (Vds) for the transistor of switch SW1 may be 30V. In this example, a Vds in excess of 30V may damage the transistor. For this reason, the examples described herein include a discharge circuit to discharge energy that may be stored in the parasitic inductance L1 when switch SW1 is to be turned OFF.

Figure 3:
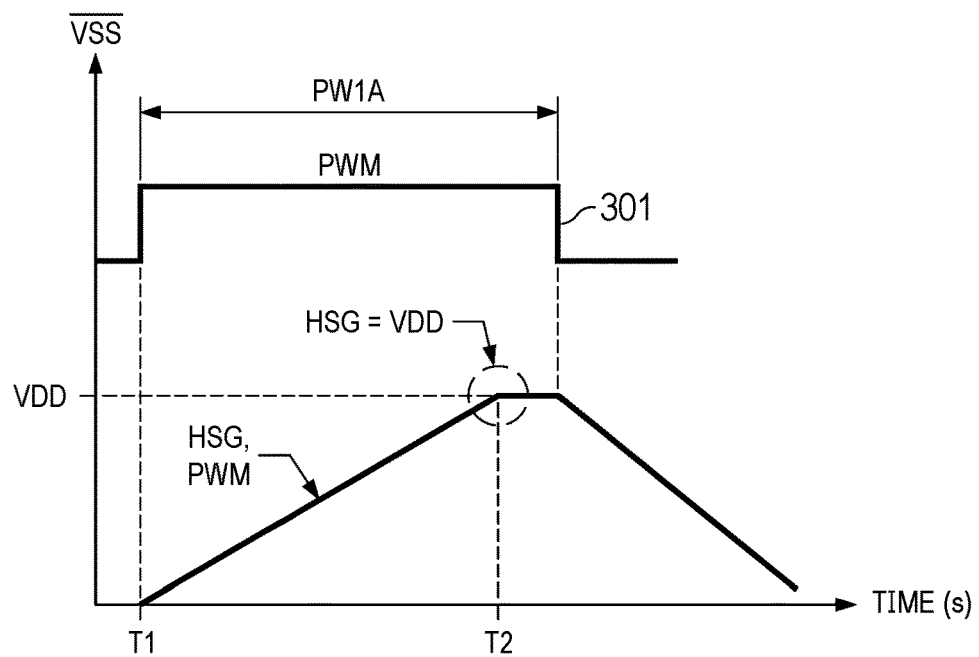
FIG. 3 is a graph of waveforms associated with the driver of FIG. 2 in which an electrical overstress condition may not occur.
Figure 4:
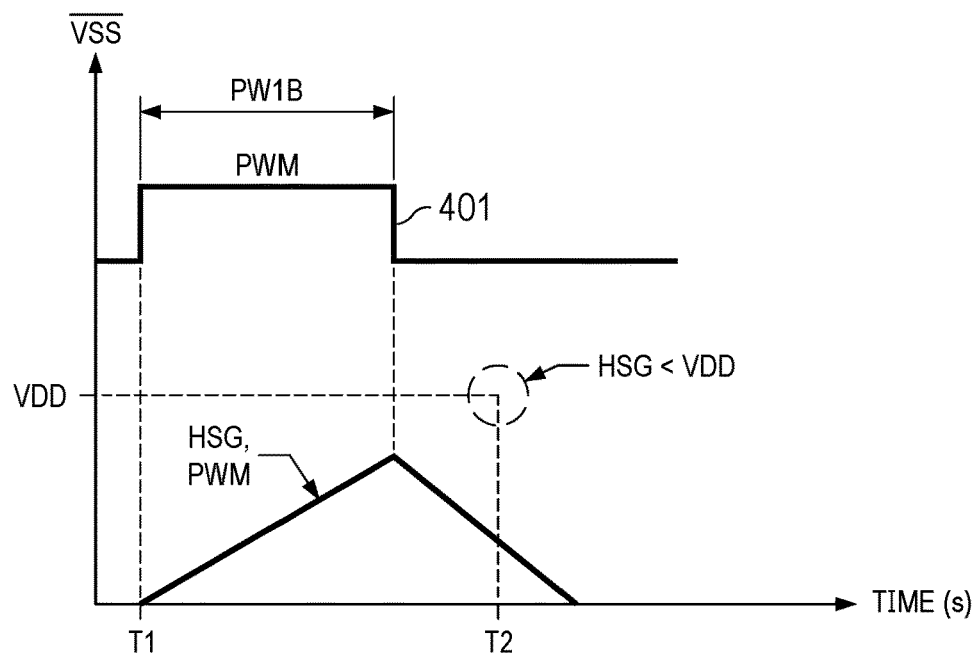
FIG. 4 is a graph of waveforms associated with the driver of FIG. 2 in which an electrical overstress condition may occur.

The problem explained above may occur when the pulse width (PW1, FIG. 2) is short enough that the parasitic capacitance C1 of the HS (or LS) transistor does not fully charge to VDD before the end of the pulse of the PWM control signal 115. FIGS. 3 and 4 are signal waveforms collectively illustrating the problem. In FIG. 3, the width of the PWM pulse is PW1A, and PW1A is long enough that HSG (voltage across parasitic capacitance C1) is able to reach VDD before the end of the PWM pulse (falling edge 301). Because HSG reaches VDD before switch SW1 turns OFF (which occurs upon occurrence of the falling edge 301 of the PWM pulse), there is little or no energy stored in parasitic inductance L1.

In FIG. 4, however, the width PW1B of the PWM pulse is short enough that HSG did not have time to reach VDD before the falling edge 401 of the PWM pulse occurs to turn off switch SW1. The amount of energy stored in the parasitic inductance L1 is a function of the voltage difference (VDD-HSG) when the current ceases flowing through the switch SW1 and thus through the parasitic inductance L1.

The width of the pulses of the PWM control signal 115 may vary depending on the load condition on a switching converter. For example, at light loads or start-up of system 100, the width of the PWM pulses may be relatively small.

Figure 5:
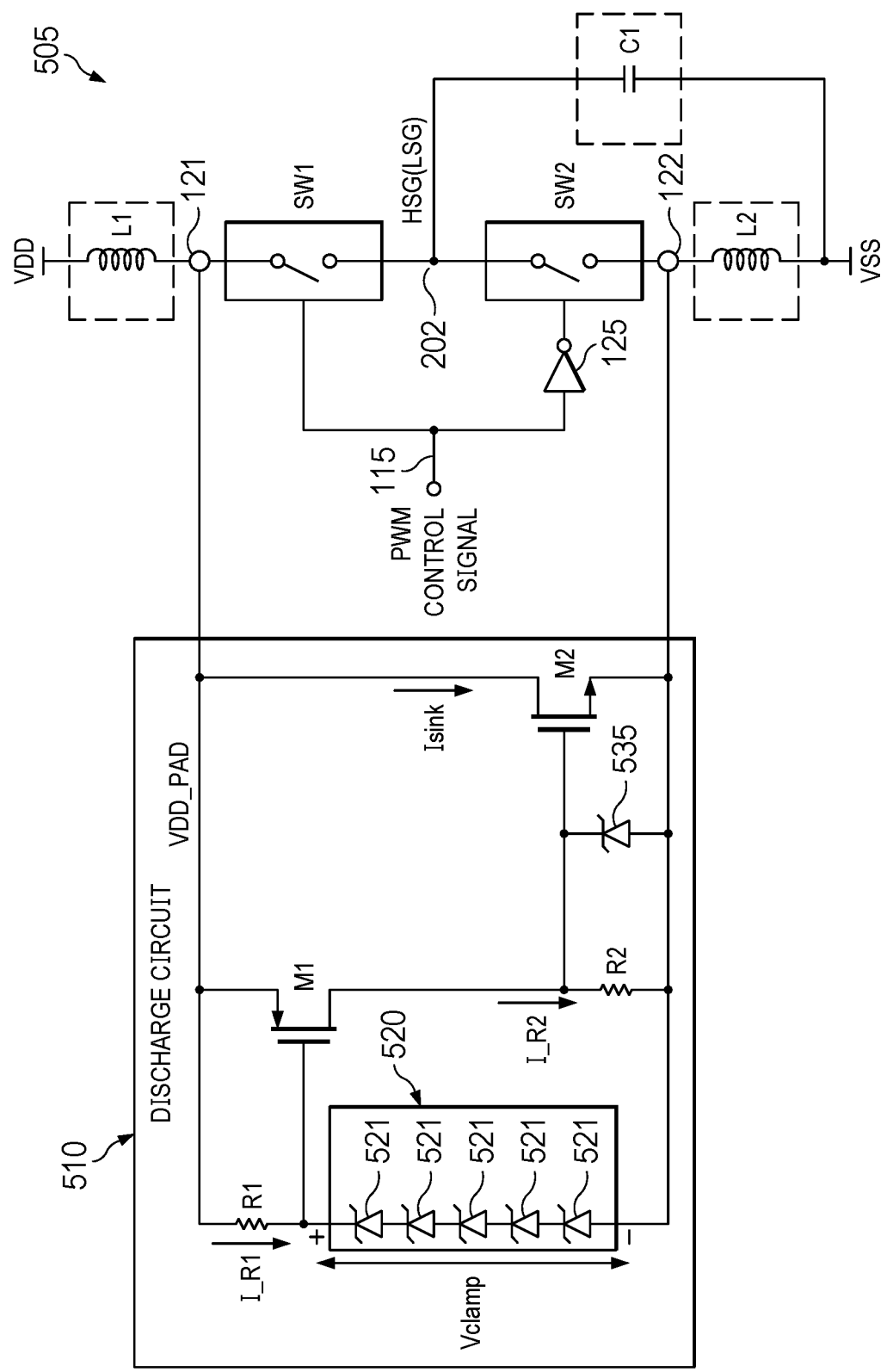
FIG. 5 is a circuit schematic of an example of driver's discharge circuit for mitigating an electrical overstress condition.

FIG. 5 is a schematic of an example driver 505, which includes a discharge circuit 510, the switches SW1 and SW2, and the inverter 125. The connections between the switches SW1 and SW2 and the inverter 125 are the same as described above with respect to FIG. 2. The voltage on the power supply terminal 121 is labeled as VDD_PAD. Voltage VDD_PAD normally is equal to VDD from the power supply 140 but may be higher than VDD due to the sudden cessation of current through when the parasitic inductance has energy stored therein. As described below, the discharge circuit 510 is triggered to discharge the energy stored in the parasitic inductance L1 responsive to the voltage VDD_PAD reaching a threshold voltage, which may be maximum safe operating voltage for the driver IC 120. The discharge circuit 510 opens a current path for the energy from parasitic inductance L1 to flow to ground thereby avoiding voltage VDD_PAD from increasing to a level that could damage the transistor that implements switch SW1.

In the example of FIG. 5, the discharge circuit 510 includes resistors R1 and R2, a voltage clamp circuit 520, transistors M1 and M2, and a Zener diode 535. Transistor M1 is a p-channel field effect transistor (PFET) and transistor M2 is an NFET but transistors M1 and/or M2 can be implemented as other types of transistors in other examples. Resistor R1 is coupled between power supply terminal 121 and the gate of transistor M1 and the voltage clamp circuit 520. The source of transistor M1 is coupled to the power supply terminal 121. The drain of transistor M1 is coupled to resistor R2, the cathode of Zener diode 535, and the gate of transistor M2. Resistor R2 and Zener diode 535 are coupled in parallel between the gate of transistor M2 and the ground supply terminal 122. The drain of transistor M2 is coupled to the power supply terminal 121. If and when transistor M2 is turned ON, a current path opens to permit current Isink to flow from the parasitic inductance L1 to VSS.

In this example, the voltage clamp circuit 520 is a fixed voltage clamp circuit which includes multiple Zener diodes 521 coupled in series between resistor R1 and the ground supply terminal 122. If switch SW1 is turned OFF while the parasitic capacitance C1 is still charging (and thus HSG has not yet reached VDD), the voltage VDD_PAD on the supply terminal 121 may become large enough such that the voltage across each Zener diode 521 reaches its Zener breakdown voltage. The Zener breakdown voltage may be the same for each Zener diode 521 or may vary from diode to diode. Responsive to all of the Zener diodes 521 having reached their breakdown voltage, current I_R1 flows through resistor R1 and through the stack of Zener diodes 521 to VSS.

Up until the point that VDD_PAD is large enough to cause the Zener diodes to reach their breakdown voltage, current I_R1 through resistor R1 is 0 A and thus the gate of transistor M1 is pulled up to the same voltage as its source (VDD_PAD). In that state, transistor M1 is OFF. With transistor M1 OFF, no drain current flows through transistor M1 and resistor R2. Accordingly, the voltage on the gate of transistor M2 is low enough (e.g., 0V) to cause transistor M2 to be OFF. Transistors M1 and M2 being OFF is the state of the discharge circuit 510 when voltage VDD_PAD is not large enough to otherwise damage the transistor that implements switch SW1.

If, however, the pulse width of the PWM pulse is short enough such that the parasitic capacitance C1 is not able to charge to VDD (HSG is less than VDD), then when switch SW1 is turned OFF, the voltage VDD_PAD may rise as described above. Eventually VDD_PAD rises to a high enough level that the Zener diodes 521 reach their breakdown voltage. When that happens, current I_R1 flows through R1 and the Zener diodes 521 of the voltage clamp circuit 520. The stack of Zener diodes 521 clamp the voltage (Vclamp) on the gate of transistor M1 at a level that is equal to the sum of the breakdown voltages of the Zener diodes 521. The voltage Vclamp is application-specific and is set by the number of Zener diodes 521 in the voltage clamp circuit and the particular breakdown voltages of each Zener diode. The value of Vclamp is set such that the Zener diodes 521 begin conducting current I_R1 when the voltage level of VDD_PAD is approximately equal to the maximum permitted VDD for the driver 505. The voltage that forms across resistor R1 is VDD minus the clamp voltage Vclamp that is imposed by the voltage clamp circuit 520 when the Zener diodes 521 reach their breakdown voltage. The voltage drop across R1 from the current I_R1 is sufficiently large (e.g., exceeds the threshold voltage of M1) that transistor M1 turns ON. In response to transistor M1 turning ON, current I_R2 flows through transistor M1 and through resistor R2 to VSS. The voltage across resistor R2 increases thereby turning ON transistor M2. Transistor M2 being ON thereby opens the current path to safely discharge the energy stored in the parasitic inductance L1 and thus not damage switch SW1. Zener diode 535 clamps the voltage on the gate of transistor M2 to protect transistor M2 from a harmful gate-to-source voltage (Vgs).

The discharge circuit 510 in the example of FIG. 5 involves a two-phase operation in response to VDD_PAD becoming large enough to possibly damage switch SW1. First, transistor M1 turns ON, and second, after transistor M1 turns ON, transistor M2 then turns ON. During the time that transistors M1 and M2 are sequentially being turned ON, the voltage VDD_PAD continues to increase, as described above. The voltage VDD_PAD continues to increase until transistor M2 turns ON opening the current path (Isink) to discharge the energy in the parasitic inductance L1. Because VDD_PAD continues to increase while the discharge circuit 510 is responding as described above, the transistor to implement switch SW1 may need to be sized larger than would otherwise be required for the maximum rated VDD for the driver. Consequently, the transistor that implements switch SW2 also may be sized the same as switch SW1's transistor, and transistor M2 may be sized the same as well. The size of the transistors of SW1 and SW2 and transistor M2 undesirably causes the overall size of the driver 505 to be relatively large.

Figure 6:
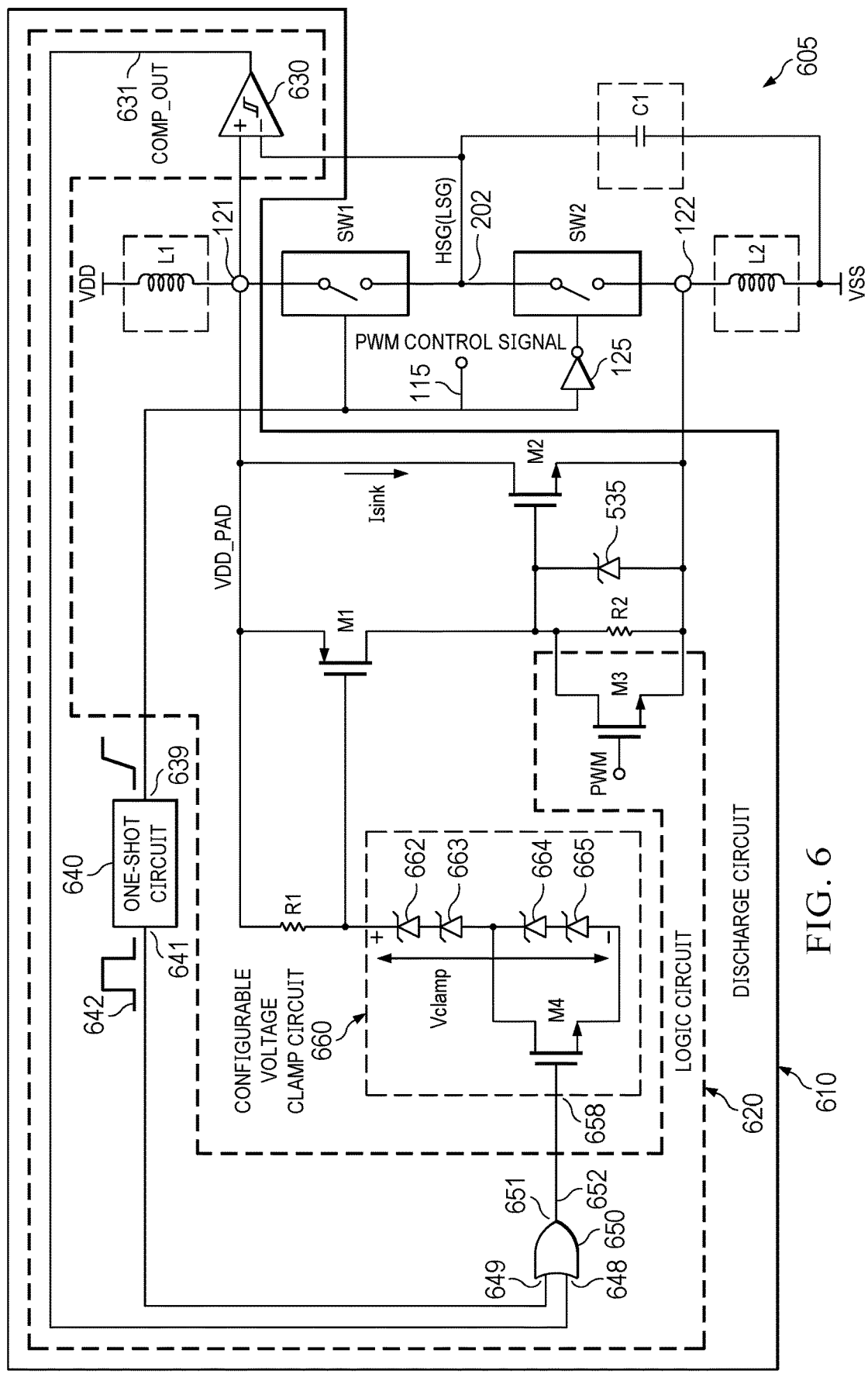
FIG. 6 is a circuit schematic of another example of a driver's discharge circuit for mitigating an electrical overstress condition.

FIG. 6 is a schematic of an example driver 605, which includes a discharge circuit 610 that solves the problem noted above with regard to the size of the transistors of SW1 and SW2 and transistor M2 of the discharge circuit 510 of FIG. 5. The discharge circuit 610 of FIG. 6 reacts faster to an increase in voltage VDD_PAD than was the case for discharge circuit 510. In addition to the discharge circuit 610, the driver 605 of FIG. 6 includes the switches SW1 and SW2, and the inverter 125, as described above.

The illustrative discharge circuit 610 in FIG. 6 includes a logic circuit 620, a configurable voltage clamp circuit 660, resistors R1 and R2, transistors M1 and M2, and Zener diode 535. The logic circuit 620 includes a comparator 630, a one-shot circuit 640, a logic gate 650 (an OR gate in this example), and a transistor M3. The comparator 630 includes a positive (+) input, a negative (−) input, and an output. The positive input of comparator 630 is coupled to the power supply terminal 121 of the driver, and thus receives the voltage VDD_PAD. The negative input of comparator 630 is coupled to the connection between switches SW1 and SW2 (connection 202) and thus receives the voltage HSG (or LSG). The comparator 630 outputs a comparator output signal COMP_OUT 631, which is at one logic level (e.g., logic high) when HSG is less than VDD, and at another logic level (e.g., logic low) when HSG is within the comparator's offset of VDD (e.g., HSG is equal to (within the comparator's offset) of VDD).

The output of comparator 630 is coupled to one input 648 of logic gate 650. The PWM control signal 115 is coupled to an input 639 of one-shot circuit 640. The output 641 of the one-shot circuit 640 is coupled to the other input 649 of logic gate 650. The configurable voltage clamp circuit 660 includes a voltage clamp control input 658 and a voltage clamp output 661. The output 651 of logic gate 650 is coupled to the voltage clamp control input 658, and thus the output signal 652 from logic gate 650 is provided to the voltage clamp control input 658. The voltage clamp output 661 is coupled to resistor R1 and to the gate of transistor M1.

As described above with respect to FIG. 5, resistor R2 and Zener diode 535 are coupled in parallel between the gate of transistor M2 and VSS. Transistor M3 (an NFET in this example) is coupled across resistor R2. When transistor M3 is ON, resistor R2 is shorted forcing transistor M2 to be OFF, and when transistor M3 is OFF, resistor R2 is not shorted and transistor M2 will be ON if transistor M1 is ON. The PWM control signal 115 is provided to the gate of transistor M3.

In this example, the configurable voltage clamp circuit 660 includes four Zener diodes 662, 663, 664, and 665, although the number of Zener diodes for the configurable voltage clamp circuit 660 is application-specific. The configurable voltage clamp circuit 660 also includes a transistor M4 (e.g., an NFET) coupled across at least one, but not all, of the Zener diodes 662-665. In this example, transistor M4 is coupled across two of the four Zener diodes 664 and 665. When transistor M4 is ON, Zener diodes 664 and 665 are shorted, and when transistor M4 is OFF, Zener diodes 664 and 665 are not shorted. The gate of transistor M4 is the voltage clamp control input 658 of the configurable voltage clamp circuit 660.

The logic circuit 620 configures the configurable voltage clamp circuit 660 for a first clamp voltage at the voltage clamp circuit output 661 responsive to the switch SW1 being ON and for a second clamp voltage at the voltage clamp circuit output 661 based on the COMP_OUT signal 631 from the comparator 630. The first clamp voltage may be smaller than the second clamp voltage. The one-shot circuit 640 produces a fixed duration output pulse 642 (e.g., 10 ns) on its output 641 in response to a rising edge on the PWM control signal 115. Through logic gate 650, the one-shot circuit's output pulse 642 is coupled to the gate of transistor M4 thereby turning ON transistor M4. The rising edge of the PWM control signal 115 initiates the process of closing switch SW1 to turn on the HS (or LS) transistor. Accordingly, the one-shot circuit's output pulse 642 occurs when the HS (or LS) transistor is turned ON. In the example in which the logic gate 650 is an OR gate (as in the example of FIG. 6), the logic gate 650 responds to the one-shot circuit's output pulse 642 by causing its output signal 652 to transition to a logic high state to turn ON transistor M3 for at least the duration of the one-shot circuit's output pulse. Logic gate 650 may cause transistor M3 to remain ON for a duration of time that is longer than the width of the pulse 642 from the one-shot circuit 640 if the COMP_OUT signal 631 from the comparator 630 (which is logically OR'd with the one-shot circuit's pulse 642 by logic gate 650) is logic high during the pulse 642 from the one-shot circuit 640 and remains logic high for a period of time thereafter. The COMP_OUT signal 631 is logic high in this example if HSG is smaller than VDD, which will be the case if the parasitic capacitance C1 of the HS (or LS) transistor was not able to fully charge to VDD before switch SW1 is opened, as described above.

By turning ON transistor M3 upon closing switch SW1, for at least the duration of the pulse 642 of the one-shot circuit 640, Zener diodes 664 and 665 are shorted thereby reducing the voltage level for VDD_PAD at which the Zener diodes 662 and 663 within the configurable voltage clamp circuit 660 reach their breakdown voltage. Accordingly, the configurable voltage clamp circuit 660 turns ON transistor M1 responsive to a lower level of VDD_PAD than was the case for the voltage clamp circuit 520 of FIG. 5. Transistor M1 in FIG. 6 turns ON in response to switch SW1 being turned ON, instead of in response to switch SW1 being turned OFF as was the case for the discharge circuit 510 of FIG. 5.

While the PWM control signal 115 is logic high (to cause switch SW1 and the HS transistor to be ON), transistor M3 is also ON thereby shorting resistor R2 and preventing transistor M2 from turning ON despite transistor M1 being ON. At the end of the positive pulse of the PWM control signal 115, switch SW1 opens and transistor M3 turns OFF. If transistor M1 is still ON at the end of the positive pulse of the PWM control signal 115, then at that point, transistor M1 is ON and transistor M2 then turns ON opening the discharge current path through transistor M2 for current Isink from the parasitic inductance L1. Because transistor M1 was previously turned ON (when switch SW1 was initially closed), the time delay associated with turning ON transistor M1 upon opening switch SW1 in FIG. 5 is avoided. Accordingly, compared to the discharge circuit 510 of FIG. 5, the discharge circuit 610 of FIG. 6 can respond faster to discharge the energy stored in parasitic inductance L1 when switch SW1 is opened. Because the discharge circuit 610 responds faster than the discharge circuit, the magnitude of the voltage VDD_PAD remains at a smaller level than was the case for the discharge circuit 610, and thus the transistors that implement switches SW1 and SW2 as well as transistor M2 can advantageously be made smaller than their counterparts in the discharge circuit 510 of FIG. 5.

Figure 7:
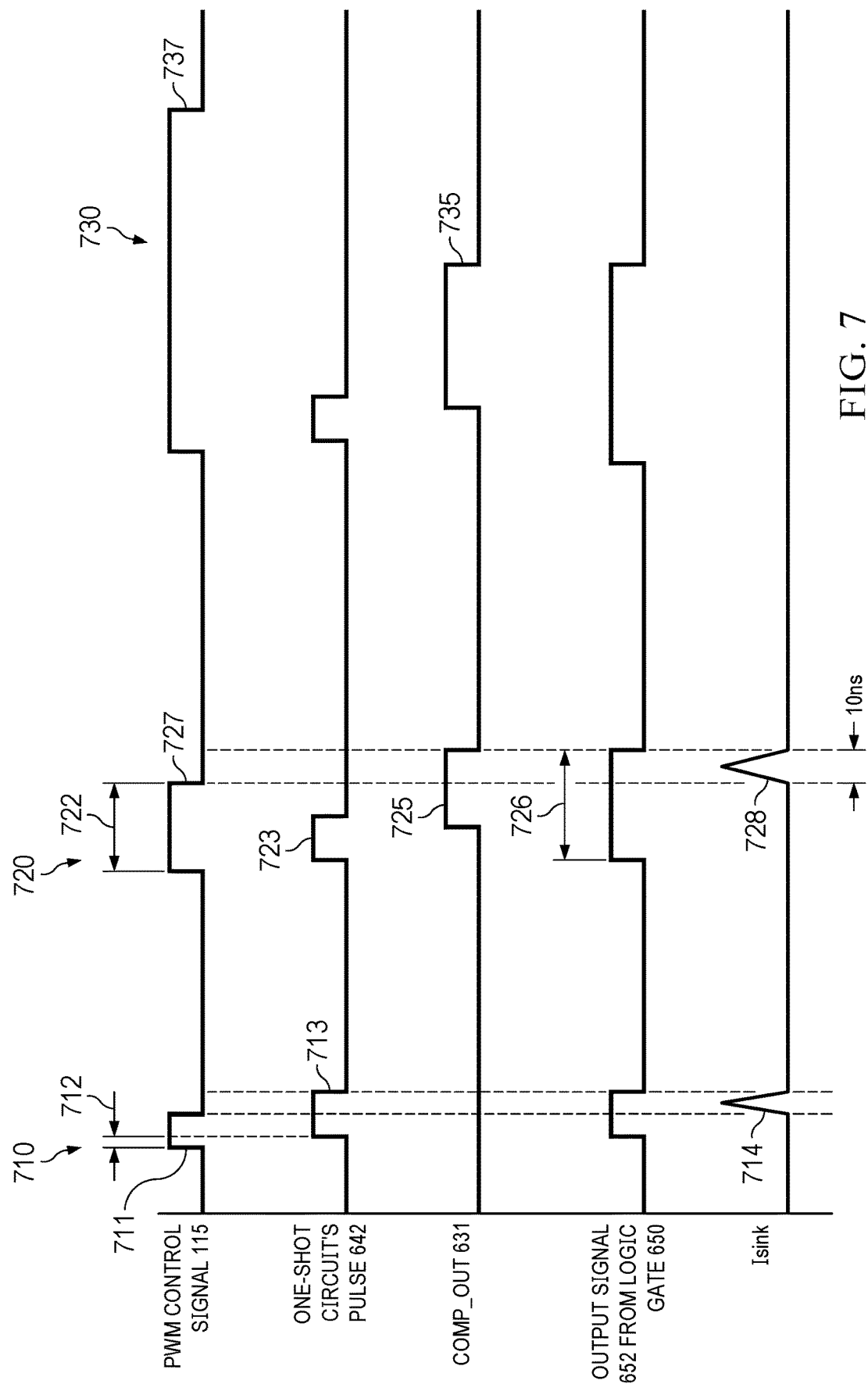
FIG. 7 is a timing diagram illustrating the operation of the discharge circuit of FIG. 6, in an example.

FIG. 7 is an example timing diagram of some of the signals associated with the discharge circuit 610 of FIG. 6. The signals include the PWM control signal 115, the one-shot circuit's output pulse 642, the COMP_OUT signal 631 from the comparator 630, and the current Isink. The timing diagram of FIG. 7 illustrates three scenarios 710, 720, and 730. Scenarios 710 and 720 illustrate PWM control signal pulse widths that are short enough that the parasitic capacitance C1 of the HS (or LS) transistor does not have time to fully charge to VDD. Scenario 730 illustrates a PWM control signal pulse width that is long enough to allow the parasitic capacitance C1 of the HS (or LS) transistor to fully charge to VDD. Scenario 710, however, illustrates that a width 712 of the PWM control signal 115 is short enough that the comparator 630 does not have time to respond to the difference between HSG (LSG) and VDD and thus the COMP_OUT signal 631 is not asserted logic high. However, the rising edge 711 of the PWM control signal 710 still causes the one-shot circuit 640 to produce the output pulse 642 (see reference numeral 713), which through logic gate 650 causes transistor M4 to turn ON thereby causing transistor M1 to turn ON. At the end of the PWM control signal's pulse for scenario 710, which occurs before the one-shot circuit's output pulse ends, transistor M1 is already ON and transistor M3 turns OFF thereby causing transistor M2 to turn ON allowing the energy from the parasitic inductance L1 to dissipate as current Isink (see reference numeral 714) through transistor M2.

For scenario 720, the width 722 of the PWM control signal 115 is longer than that for scenario 710 but still short enough that the parasitic capacitance C1 does not have time to charge to VDD. The one-shot circuit 640 still produces a pulse, as indicated by reference numeral 723. In this scenario, the comparator 630 has time to react and its output signal COMP_OUT 642 becomes logic high (see reference numeral 725) responsive to HSG (or LSG) being smaller than VDD. The output signal 652 from logic gate 650 is the logical OR of the pulse 642 from the one-shot circuit 640 and COMP_OUT 631 from the comparator 630. The time duration 726 of output signal 652 is long enough such that when the PWM control signal pulse ends at falling edge 727, transistor M1 is already ON and transistor M3 turns OFF thereby causing transistor M2 to turn ON to allow the Isink current (reference numeral 728) to flow from the parasitic inductance L1 to VSS.

For scenario 730, the signaling is similar to that of scenario 720, but the parasitic capacitance C1 fully charges to VDD before the falling edge 737 occurs for the PWM control signal 115. Accordingly, the comparator's output signal 651 is logic low and the one-shot circuit's output pulse 642 has ended by the time switch SW1 turns OFF, and thus transistor M3 is turned OFF as well by logic gate 650. In this state, the logic circuit configures the configurable voltage clamp circuit 660 for a higher clamp voltage, which is associated with a level of VDD_PAD that is higher than the maximum permitted VDD for the driver. The level of VDD_PAD sufficient to activate the voltage clamp circuit 660 to turn ON transistor M1 is not reached because the parasitic capacitance C1 fully charged to VDD and there was little or no energy stored in the parasitic inductance L1.

Figure 8:
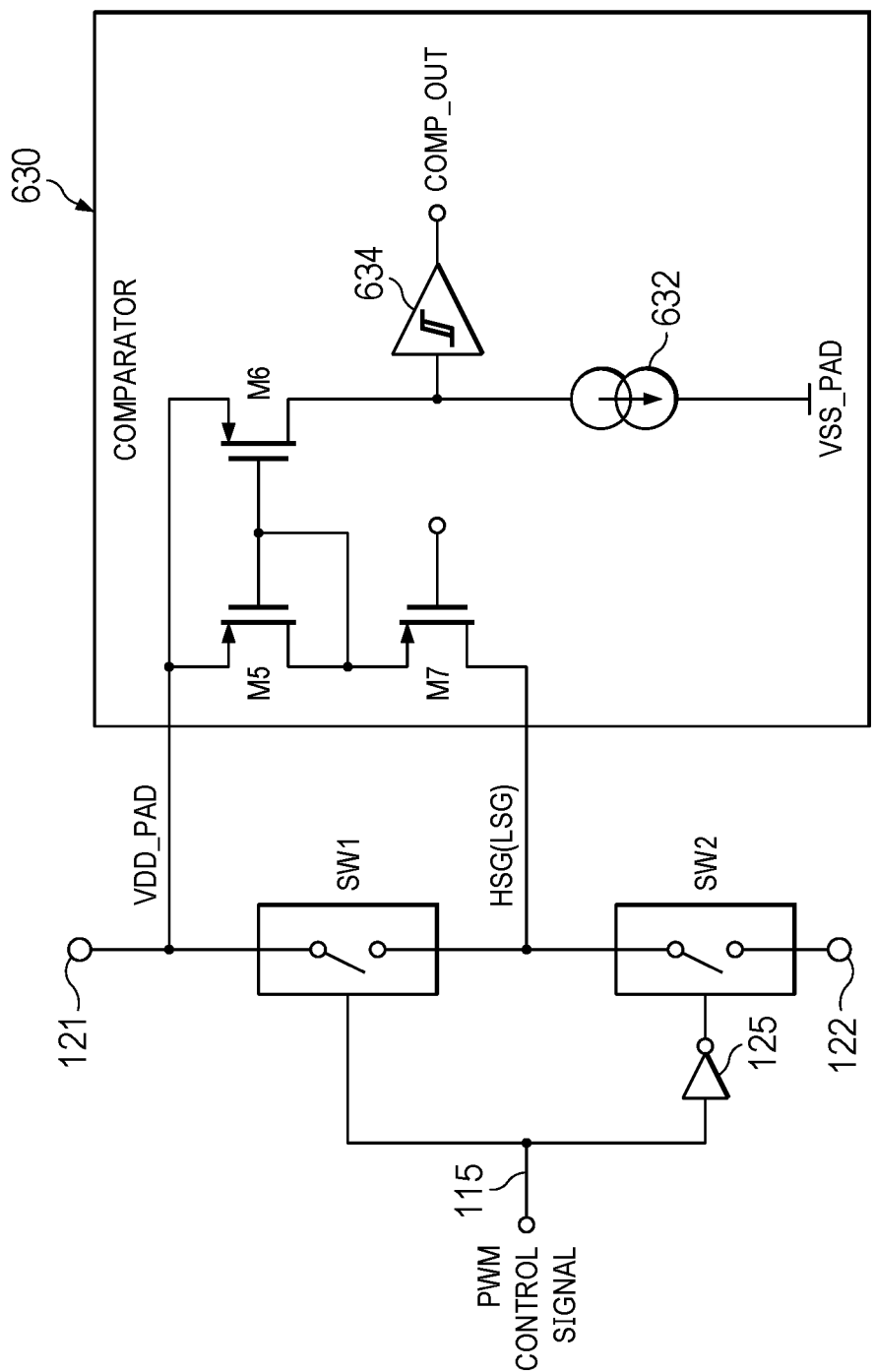
FIG. 8 is a circuit schematic for implementing a comparator of the discharge circuit of FIG. 6, in one example.

FIG. 8 is a schematic of an example implementation of comparator 630, which includes transistors M5, M6, and M7, current source 632, and a Schmitt trigger circuit 634. In this example, transistors M5-M7 are p-type field effect transistors (PFETs). The sources of transistors M5 and M6 are coupled to VDD_PAD. Transistors M5 and M6 are configured as a current mirror. Transistor M7 is biased by a fixed voltage reference, and is coupled between the drain of transistor M5 and HSG (or LSG). If the voltage of VDD_PAD is larger than HSG (parasitic capacitance C1 is not fully charged), then drain current flows through transistors M5 and M7. If the voltage of HSG has reached VDD, then no current flows through transistor M5. Current that flows through transistor M5 is mirrored (e.g., a 1:1 current mirror ratio) through transistor M6. The input voltage to the Schmitt trigger circuit 634 will be logic high if current flowing through transistor M6 is greater than the magnitude of the current of current source 632, and will otherwise be logic low if no current flows through transistor M6.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead with little or no change to the remaining circuitry. For example, a field effect transistor ("FET") (such as an n-channel FET (NFET) or a p-channel FET (PFET)), a bipolar junction transistor (BJT—e.g., NPN transistor or PNP transistor), an insulated gate bipolar transistor (IGBT), and/or a junction field effect transistor (JFET) may be used in place of or in conjunction with the devices described herein. The transistors may be depletion mode devices, drain-extended devices, enhancement mode devices, natural transistors or other types of device structure transistors. Furthermore, the devices may be implemented in/over a silicon substrate (Si), a silicon carbide substrate (SiC), a gallium nitride substrate (GaN) or a gallium arsenide substrate (GaAs).

References may be made in the claims to a transistor's control input and its current terminals. In the context of a FET, the control input is the gate, and the current terminals are the drain and source. In the context of a BJT, the control input is the base, and the current terminals are the collector and emitter.

References herein to a FET being "ON" means that the conduction channel of the FET is present and drain current may flow through the FET. References herein to a FET being "OFF" means that the conduction channel is not present so drain current does not flow through the FET. An "OFF" FET, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter or, if the parameter is zero, a reasonable range of values around zero.

Modifications are possible in the described embodiments, and other embodiments are possible, within the scope of the claims.

What is claimed is:
1. A driver, comprising:
a first switch;
a second switch coupled between a voltage supply terminal and the first switch at a switch output, the second switch having a switch control input;
a first transistor having a first control input and first and second current terminals;

a configurable voltage clamp circuit having a voltage clamp control input and a voltage clamp circuit output coupled to the first control input;

a second transistor having a second control input and third and fourth current terminals, the second control input coupled to the second current terminal, and the third current terminal coupled to the voltage supply terminal; and a logic circuit including a comparator having a comparator output, the logic circuit coupled to the voltage supply terminal, and the voltage clamp control input, the logic circuit to configure the configurable voltage clamp circuit for a first clamp voltage at the voltage clamp circuit output responsive to the first switch being turned ON and for a second clamp voltage at the voltage clamp circuit output based on a signal at the comparator output.

2. The driver of claim 1, wherein the logic circuit comprises a one-shot circuit, and wherein the logic circuit is configured to configure the configurable voltage clamp circuit for the first clamp voltage responsive to the first switch being turned ON and for a time period based on least a pulse duration of a pulse generated by the one-shot circuit.

3. The driver of claim 2, wherein the logic circuit is configured to configure the configurable voltage clamp circuit for the first clamp voltage for a time period equal to a duration of the pulse generated by the one-shot circuit and, when the comparator output is at a first logic state during the pulse generated by the one-shot circuit, a time period after the pulse from the one-shot circuit until the signal at the comparator output changes from the first logic state to a second logic state.

4. The driver of claim 1, wherein the first clamp voltage is smaller than the second clamp voltage.

5. The driver of claim 1, wherein the comparator has a first comparator input and a second comparator input, the first comparator input coupled to the voltage supply terminal, and the second comparator input coupled to the switch output.

6. The driver of claim 5, wherein the logic circuit comprises a one-shot circuit and a logic gate, the logic gate having first and second logic gate inputs and a logic gate output, the first switch has a switch control input, the first logic gate input coupled to the comparator output, and the one-shot circuit coupled between the switch control input and the second logic gate input.

7. The driver of claim 6, wherein the logic gate is an OR gate.

8. The driver of claim 1, wherein the configurable voltage clamp circuit comprises:
a first Zener diode;
a second Zener diode coupled in series with the first Zener diode between the first control input and a ground terminal; and
a third transistor coupled across the second Zener diode.

9. The driver of claim 8, wherein the third transistor has a third control input that is the voltage clamp control input.

10. The driver of claim 1, wherein the configurable voltage clamp circuit comprises:
at least four Zener diodes coupled in series between the first control input and a ground terminal; and
a third transistor coupled across at least two of the Zener diodes, the third transistor has a third control input that is the voltage clamp control input.

11. The driver of claim 1, wherein the configurable voltage clamp circuit comprises:
a first Zener diode;
a second Zener diode coupled in series with the first Zener diode between the first control input and a ground terminal; and
a third transistor coupled across the second Zener diode, the third transistor having a control input that is the voltage clamp control input.

12. A driver, comprising:
a first switch having a switch control input;
a second switch coupled between a voltage supply terminal and the first switch at a switch output;
a first transistor having a first control input and first and second current terminals;
a configurable voltage clamp circuit having a voltage clamp control input and a voltage clamp circuit output, the voltage clamp circuit output coupled to the first control input;
a second transistor having a second control input and third and fourth current terminals, the second control input coupled to the second current terminal, and the third current terminal coupled to the voltage supply terminal; and
a logic circuit including a one-shot circuit, the logic circuit coupled to the voltage supply terminal, the switch control input, and the voltage clamp control input, the logic circuit to configure the configurable voltage clamp circuit for a first clamp voltage at the voltage clamp circuit output responsive to the first switch being turned ON and for a second clamp voltage at the voltage clamp circuit output responsive to a voltage on the switch output reaching a threshold associated with a voltage on the voltage supply terminal.

13. The driver of claim 12, wherein the logic circuit is configured to configure the configurable voltage clamp circuit for the first clamp voltage responsive to the first switch being turned ON and for a time period based on least a pulse duration of a pulse generated by the one-shot circuit.

14. The driver of claim 12, wherein the first clamp voltage is smaller than the second clamp voltage.

15. The driver of claim 12, wherein the logic circuit comprises a comparator having a first comparator input, a second comparator input, and a comparator output, the first comparator input coupled to the voltage supply terminal, and the second comparator input coupled to the switch output.

16. The driver of claim 15, wherein the first switch has a switch control input, and the logic circuit comprises a logic gate having first and second logic gate inputs and a logic gate output, the first logic gate input coupled to the comparator output, and the one-shot circuit coupled between the switch control input and the second logic gate input.

17. A driver, comprising:
a first switch;
a second switch coupled between a voltage supply terminal and the first switch at a switch output;
a comparator having a first comparator input, a second comparator input, and a comparator output, the first comparator input coupled to the voltage supply terminal, and the second comparator input coupled to the switch output;
a first transistor having a first control input and first and second current terminals;
a plurality of Zener diodes coupled in series between the first control input and a ground terminal;
a second transistor having a second control input and third and fourth current terminals, the second control input coupled to the second current terminal, and the third current terminal coupled to the voltage supply terminal;

a third transistor coupled across some, but not all, of the plurality of Zener diodes, the third transistor having a third control input; and a logic gate having a logic gate input and a logic gate output, the logic gate input coupled to the comparator output, and the logic gate output coupled to the third control input.

18. The driver of claim 17, wherein the logic gate input is a first logic gate input and the logic gate has a second logic gate input, the first switch has a switch control input, and the driver further comprises a one-shot circuit coupled between the switch control input and the second logic gate input.

19. The driver of claim 17, wherein the logic gate is an OR gate.

20. The driver of claim 17, further comprising:

a first resistor and a second resistor, wherein:
- the first resistor includes a first terminal coupled to the voltage supply terminal, and a second terminal coupled to the first control input of the first transistor;
- the second resistor includes a first terminal coupled to the second control input of the second transistor, and a second terminal coupled to the ground terminal; and a fourth transistor coupled across the second resistor.

\* \* \* \* \*